United States Patent [19]

Pawlowski

[11] Patent Number: 4,940,646

[45] Date of Patent: Jul. 10, 1990

[54] POLYVINYL ACETAL WITH HYDROXY ALIPHATIC ACETAL GROUPS USEFUL IN PHOTOSENSITIVE NEGATIVE WORKING COMPOSITIONS

[75] Inventor: Georg Pawlowski, Wiesbaden, Fed. Rep. of Germany

[73] Assignee: Hoechst Aktiengesellschaft, Frankfurt, Fed. Rep. of Germany

[21] Appl. No.: 135,316

[22] Filed: Dec. 21, 1987

[30] Foreign Application Priority Data

Dec. 23, 1986 [DE] Fed. Rep. of Germany ....... 3644162

[51] Int. Cl.$^5$ ............................ G03C 1/60; G03C 1/68
[52] U.S. Cl. ..................................... 430/175; 430/176; 430/192; 430/197; 430/278; 430/300; 430/302; 430/325; 430/281; 430/909
[58] Field of Search ............... 430/175, 176, 270, 281, 430/192, 197, 909

[56] References Cited

U.S. PATENT DOCUMENTS

| | | | |
|---|---|---|---|
| 3,396,019 | 8/1968 | Uhlig | 430/176 |
| 3,867,147 | 2/1975 | Teuscher | 430/175 |
| 4,387,151 | 6/1983 | Bosse et al. | 430/175 |
| 4,631,245 | 11/1986 | Pawlowski | 430/175 |
| 4,652,604 | 3/1987 | Walls et al. | 430/175 |
| 4,670,507 | 6/1987 | Walls et al. | 430/176 |
| 4,692,397 | 9/1987 | Liu | 430/175 |
| 4,707,437 | 11/1987 | Walls et al. | 430/175 |
| 4,741,985 | 5/1988 | Aoai et al. | 430/175 |
| 4,774,161 | 9/1988 | Sekiya et al. | 430/175 |
| 4,780,392 | 10/1988 | Walls et al. | 430/909 |

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A polyvinyl acetal is described which contains 4 to 40 mol-% vinyl alcohol units, 1 to 20 mol-% vinyl acetate units, 0 to 85 mol-% vinyl acetal units derived from an aldehyde free of OH groups and 1 to 85 mol-% vinyl acetal units derived from an aldehyde containing OH groups. The polymer is suitable as binder for photosensitive mixtures, in particular for the preparation of printing plates and photoresists. The layers obtained therewith can be developed with neutral or weakly alkaline, purely aqueous solutions and produce printing plates with a high print run performance and good ink receptivity.

9 Claims, No Drawings

POLYVINYL ACETAL WITH HYDROXY ALIPHATIC ACETAL GROUPS USEFUL IN PHOTOSENSITIVE NEGATIVE WORKING COMPOSITIONS

BACKGROUND OF THE INVENTION

The invention relates to a novel polyvinyl acetal which is suitable, in particular, as a binder for photosensitive mixtures in recording materials which are used to prepare printing plates and photoresists.

Photosensitive mixtures which contain polyvinyl acetals, for example, polyvinyl formal or polyvinyl butyral, as binders and diazonium salt polycondensation products as photosensitive compounds are disclosed in U.S. Pat. No. 3,867,147. If the binders are contained in a sufficient quantitative proportion and have a sufficient oleophilic nature, photolithographic plates having high print run performance are obtained. These photosensitive printing plates require aqueous solutions for their development which contain relatively large quantities of organic solvents. Since vapors and wastewaters originating from these developers are no longer acceptable on ecological grounds, efforts are being made to achieve the development of printing plates of this type with purely aqueous solutions. The plates can be developed with relatively corrosive acid or alkaline, purely aqueous solutions by suspending the non-image areas of the layer in the developer in the form of flakes or smaller particles. In this case, there is the risk that such particles may be redeposited on the non-image areas of the plate, rendering the plates unusable.

German Offenlegungsschrift No. 3,036,077 (=U.S. Pat. No. 4,387,151) discloses the use of photosensitive mixtures of co-condensation products of diazonium salts capable of condensation and other nonphotosensitive compounds capable of condensation in combination with polymeric binders which have lateral alkenylsulfonylurethane groups for preparing printing plates. The mixtures can be developed with purely aqueous, alkaline solutions. When they are processed to produce lithographic printing plates, they produce light-hardened layers having unsatisactory ink receptivity.

European Patent Application No. 152,819, discloses photosensitive mixtures of diazonium salt polycondensation products and binders containing carboxyl groups which are obtained by reacting polymers containing hydroxyl groups with acid anhydrides. The mixtures can be developed with aqueous alkaline solutions and are suitable for preparing lithographic printing plates with high print-run performance. Just like other mixtures with binders containing carboxyl groups, the mixtures have the disadvantage that, when processed with developers based on tap water, they tend to precipitate sparingly soluble calcium salts which are deposited in the development machines and result in breakdowns.

In the unpublished European Patent Applications Nos. 86,110,604 and 86,110,605 (priority date in both cases: Aug. 2nd, 1985), certain polyvinyl acetals and photosensitive mixtures prepared therefrom are described which can be developed with purely aqueous developers. The polymers contain certain quantitative proportions of 1,2-vinyl acetal units, 1,3 vinyl acetal units and intermolecular acetal groups.

SUMMARY OF THE INVENTION

It is therefore an object of the invention to provide novel polyvinyl acetals and photosensitive mixtures containing the same which can be developed with purely aqueous, neutral or weakly alkaline solutions.

It is another object of the invention to provide photosensitive mixtures which yield image areas with good oleophilic properties, resistance to abrasion during printing and etching resistance.

It is a further object of the invention to provide a photosensitive mixture that does not produce any troublesome precipitations when processed with developer solutions containing tap water.

According to the invention, a polymer of the general formula I

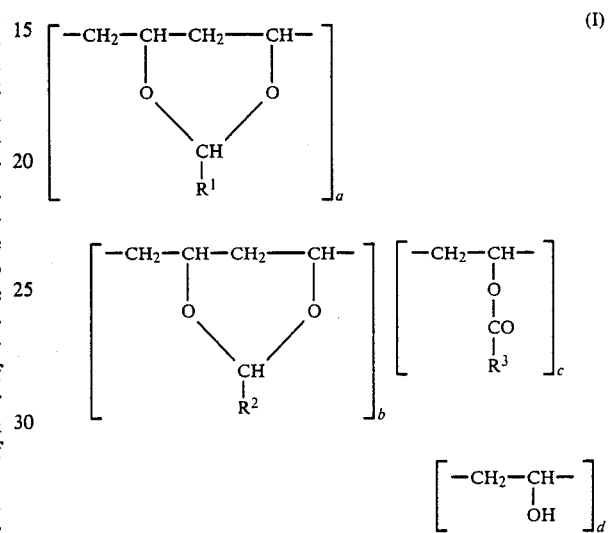

is provided in which
$R^1$ is one of the radicals

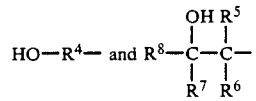

$R^2$ is a hydrogen atom, a substituted or unsubstituted alkyl radical containing 1 to 6 carbon atoms, a substituted or unsubstituted aryl radical, $R^3$ is an alkyl radical containing 1 to 4 carbon atoms, $R^4$ is a substituted or unsubstituted alkylene group containing 1 to 6 carbon atoms, $R^5$ and $R^6$ are identical or different and denote hydrogen atoms, alkyl radicals containing 1 to 6 carbon atoms, alkoxy radicals containing 1 to 4 carbon atoms, hydroxyalkyl radicals containing 1 to 3 carbon atoms or hydroxyl groups, $R^7$ is a hydrogen atom or an alkyl radical containing 1 to 6 carbon atoms, $R^8$ is a hydrogen atom, an alkyl, hydroxyalkyl or alkoxyalkyl radical containing 1 to 6 carbon atoms or a substituted or unsubstituted aryl radical containing 6 to 10 carbon atoms, a is a number from 0.01 to 0.85, b is a number from 0 to 0.85, c is a number from 0.01 to 0.20, d is a number from 0.04 to 0.40 and the sum of $a+b+c+d=1$.

According to the invention, a photosensitive mixture is provided which comprises a light-hardenable substance and a polyvinyl acetal of the general formula I as essential constituents.

According to the invention, a photosensitive recording material with a layer base and a photosensitive layer is also provided, wherein the photosensitive layer comprises a photosensitive mixture corresponding to the above definition.

DESCRIPTION OF THE PREFERRED EMBODIMENTS

The polymers of the formula I according to the invention contain at least three, preferably four different types of units in the molar ratios specified above. In a preferred embodiment, a is preferably a number from 0.05 to 0.8, b is a number from 0.2 to 0.6, c is a number from 0.01 to 0.15 and d is a number from 0.04 to 0.2. The hydrophilic nature of the polymers increases with higher values of a and d. At the same time, however, the solubility in organic solvents is retained, in particular with higher values of a, even at relatively high hydroxyl numbers.

In the compounds of the formula I, the symbols preferably have the following meanings:

If $R^2$ is an alkyl radical, it may contain preferably halogen atoms, aryl, aryloxy or alkoxy groups as substituents. The alkyl radical $R^2$ itself has preferably 1 to 4 carbon atoms, its aromatic substituents have 6 to 8 and its aliphatic substituents 1 to 3 carbon atoms.

If $R^2$ is an aryl radical, it may contain, in particular, halogen atoms, alkyl, alkoxy or carboxylic acid ester radicals as substituents.

As aryl radicals, mononuclear aryl radicals are generally preferred which, including substituents, may contain up to 10 carbon atoms.

$R^3$ is preferably a methyl radical.

$R^4$ may contain, in particular, halogen atoms or alkoxy groups as substituents and has in total 1 to 6, preferably 2 to 5 carbon atoms.

$R^5$ and $R^6$ are preferably hydrogen atoms, alkyl radicals containing 1 to 4 carbon atoms or hydroxymethyl radicals.

$R^7$ is preferably a hydrogen atom.

$R^8$ is preferably a hydrogen atom or an alkyl radical containing 1 to 4 carbon atoms, a hydroxyalkyl or an alkoxyalkyl radical containing 1 to 4 carbon atoms.

The radical $R^1$ contains at least one and up to three, preferably up to 2 hydroxyl groups.

The polymers according to the invention preferably have mean molecular weights of about 5,000 to 250,000 and hydroxyl numbers from about 150 to 600.

Starting substances for the preparation of the polymers according to the invention are vinyl acetate-vinyl alcohol copolymers containing at least about 80% vinyl alcohol units and having mean molecular weights of about 3,000 to 150,000 or over, preferably about 20,000 to 100,000. Such copolymers can be prepared simply or are commercially available. Of the commercially available polyvinyl alcohols, those are preferred which have a degree of saponification of about 88–98 % and K values of about 4 to 20.

If it is intended to use the polymers according to the invention in photosensitive layers for lithographic printing plates, it is preferred that the starting polymers containing hydroxyl groups have a molecular weight between about 20,000 and 100,000 or over, and a vinyl acetate content of less than about 15%. If the light sensitive layers are employed as silk-screen stencils or in the resist technique for preparing etch resists and the like, those starting polymers are particularly suitable which have molecular weights below about 50,000 and a vinyl acetate proportion of more than about 5%.

To prepare vinyl acetal units containing an $R^1$ radical, aldehydes of the general formulae II and III are used in which $R^4$ to $R^8$ have the meanings described above:

$$HO-R_4-CHO \qquad (II)$$

Such aldehydes are in some cases commercially available, and in other cases they can be prepared by known methods in a simple manner. A comprehensive description of the synthesis possibilities of aldehydes of the formula III are specified in Organic Reactions, Volume 16, pages 80 and 86 to 102. In addition, there are numerous further synthesis methods for the aldehydes of the general formulae II and III, some of which are reviewed in Houben-Weyl, volumes 4/1a, pages 375 et seq., 4/1d, pages 348 et seq., 6/1a, pages 452 et seq., 7/1, pages 89 and 170 et seq., and also E 3, pages 212 et seq., 348 et seq., 439 et seq., 474 et seq., or 659 et seq.

To prepare copolymer units containing an $R^2$ radical, aldehydes of the general formula IV are used in which $R^2$ has the above specified meaning:

$$R^2-CHO \qquad (IV)$$

Such aldehydes are also for the most part commercially available or can be prepared by known methods. Some preparation examples for suitable aldehydes are described in the exemplary embodiments.

Examples of suitable aldehydes of the general formulae II and III are:

2-hydroxyethanal,
3-hydroxypropanal,
2,3-dihydroxypropanal,
2-methyl-3-hydroxypropanal,
2,2-dimethyl-3-hydroxypropanal,
2-methyl-2-methylolpropanal,
2-hydroxybutanal,
3-hydroxybutanal,
4-hydroxybutanal,
3-hydroxy-2-methylbutanal,
3-hydroxy-2-ethylbutanal,
2-methyl-2-methylolbutanal,
2,2-dimethyl-3-hydroxybutanal,
2,2-dimethylolbutanal,
2,2-dimethylol-3-hydroxybutanal,
2-hydroxypentanal,
3-hydroxypentanal,
3-hydroxy-2-methylpentanal,
2,2-dimethyl-3-hydroxypentanal,
2-ethyl-3-hydroxypentanal,
2-methylolpentanal,
5-hydroxypentanal,
3-hydroxyhexanal,
3-hydroxy-2-methylhexanal,
2-ethyl-3-hydroxyhexanal,
3-hydroxy-2-methoxy-5-oxahexanal, 2,2-diethyl-3-hydroxyhexanal,
3-hydroxy-2,2,5-trimethylhexanal,
2-ethyl-2,4-dimethyl-3-hydroxyhexanal,
3-hydroxy-2-isopropyl-5-methylhexanal,
2,2-dimethylolhexanal,
2,2-dimethyl-3-hydroxyheptanal,
2-methyl-2-methylolheptanal,
2,2-dimethylolheptanal and
2-butyl-3-hydroxyoctanal.

Of these aldehydes, the self-condensation products of acetaldehyde and its higher homologs and also the condensation products of acetaldehyde with propionaldehyde or higher aliphatic aldehydes and also 4-hydroxybutanal and 5-hydroxypentanal are preferred.

Examples of suitable aldehydes of the formula IV are:
Formaldehyde, acetaldehyde, propanal, n-butanal, isobutanal, pentanal, benzaldehyde, 2-, 3-or 4-methylbenzaldehyde, 2-, 3- or 4-methoxybenzaldehyde, 2-, 3- or 4 chlorobenzaldehyde, ethyl 4-formylbenzoate and, less preferred, 4-carboxybenzaldehyde.

Instead of the free aldehydes, the corresponding acetals with lower alcohols, for example, 2-methoxyacetaldehydedimethylacetal, bromoor chloroacetaldehydediethylacetal or the reaction products of phenols with haloalkyldialkylacetals may also be employed. The acetals may be reacted directly or after being hydrolyzed to the aldehyde with the polymers.

Preferred aldehydes of the formula IV are formaldehyde, acetaldehyde, propanal, n-butanal, isobutanal, benzaldehyde, p-chlorobenzaldehyde, 3-and 4-methoxybenzaldehyde.

The preparation of the polyvinyl acetals according to the invention can be carried out by two processes:

In the first embodiment, a suitable vinyl alcohol/vinyl acetate copolymer which has at least about 80 mol-% vinyl alcohol units is dispersed in an alcohol, a catalytic quantity of an inorganic or strong organic acid and an aldehyde or an aldehyde mixture are added in such a quantity that preferably at least about 50% of the hydroxyl groups are acetalated, and heated. The polymer solution obtained which optionally contains an antioxidant, can be incorporated directly into the mixtures according to the invention or the polymer can be precipitated by adding it to a nonsolvent dropwise and purified.

In the second embodiment, the vinyl alcohol/vinyl acetate copolymer is dissolved in an aqueous or an aqueous alcoholic solution and the aldehyde or the aldehyde mixture is added. Then, an aqueous mixture of an inorganic or strong organic acid, optionally with a wetting agent or an antioxidant added, is added dropwise at room temperature. During this process the polyvinyl acetal is precipitated. The reaction is completed by heating the mixture to temperatures between about 30° C. and 60° C., and the polymer isolated is purified by washing with water or dissolving and reprecipitating.

The first embodiment is preferred, particularly if the polymer according to the invention is intended to have a hydroxyl number of more than 450 mg of KOH per g of polymer. These polymers dissolve in aqueous solutions containing surfactants. In addition, this process is also suitable if aldehydes of different reactivity or aldehydes which are insoluble in aqueous solutions and solid at room temperature are employed.

For this purpose the vinyl acetate/vinyl alcohol copolymer is dispersed in an alcohol, preferably ethanol. Optionally, a small quantity of water can be added to the alcohol so that the polymer is incipiently dissolved in the mixture. The ratio of solvent or solvent mixture to polymer is preferably about 10:1 to 100:1. The mixture is stirred very vigorously.

The quantity of acid added is preferably about 1% to 25% by weight referred to the polymer. Suitable acids are in particular hydrochloric acid or sulfuric acid; phosphoric acid or toluene sulfonic acid may also be used, but are less preferred. Then the aldehyde or the aldehyde mixture is added all at once and the mixture heated at about 60° C. -150° C. until all the polyvinyl alcohol has gone into solution. From this point on, further stirring of the mixture is continued for 2 to 20 hours, preferably 2-6 hours, at temperatures between about 50° C. and 150° C. The quantity of aldehyde added depends on the requirements, generally about 0.1 to 2.0, preferably about 0.25 to 1.5 mol of aldehyde being added per mol of vinyl alcohol. Depending on requirements, the clear solution can be employed directly provided the acid present has no disadvantageous effect on the photosensitive mixture. In addition, the solution contains varying proportions of low-molecular acetals which are formed by acetalation of the aldehyde with the solvent. It is therefore frequently more beneficial to precipitate the polymer by pouring it into a nonsolvent and finally drying it, as a result of which the acid can be separated and the monomeric acetals removed. A suitable nonsolvent is frequently water, to which, optionally, a fairly large quantity of an inorganic salt is added in order to achieve a salting out of the polymer according to the invention.

The second process results in more uniform products and is used, in particular, if the polymer according to the invention is intended to have a hydroxyl number between 150 and 450. In this case, an approximately 3% to 20% solution of the polyvinyl alcohol in water is prepared. The aldehyde or the aldehyde mixture, which in this case should preferably be liquid, is added to this solution at room temperature and while stirring vigorously. An antioxidant (for example, 2,6-di-tert-butylcresol) is optionally added to this well stirred suspension and then the acid, preferably as an approximately 5-25% aqueous solution, is added dropwise. A surfactant, whose nature should in each case be determined anew for the required application purpose, may optionally be added to the aqueous acid. After some time, the polymeric reaction product precipitates with the optimized conditions, in general as a coarse- or fine-grain, occasionally adhesive powder. Stirring of the mixture is continued for 1 to 5 hours and further acid is then added to it, about 0.05 to 0.5 mol of acid per mol of aldehyde being preferred. The mixture is heated to 35° C. to 85° C. and stirred for a further 2 to 6 hours. Then the polymer is filtered off, amply washed with water and dried. Preferably, the polymer is dissolved in an organic solvent, for example an alcohol and then precipitated in a large quantity of a nonsolvent, preferably water. The stoichiometric ratios used in the second preparation process correspond, unless otherwise specified, to those of the first preparation process.

The polymers prepared according to the invention are produced, in particular after precipitation in a nonsolvent, as amorphous, colorless products which can, however, readily be separated off. It is preferred that the products be adequately dried before they are used in photosensitive layers.

In combination with the various negativeworking photosensitive substances, such as diazonium salt polycondensation products, photopolymerizable mixtures, azido derivatives or quinonediazides, the polymers which can be obtained in this way yield layers which can be developed easily and without staining and which, depending on the nature of the composition, can be developed with water, aqueous solutions with small amounts of inorganic salts and/or surfactants added, or with aqueous alkaline solutions. The layers are remarkable for comparatively high resistance to abrasion, good ink receptivity and storage stability, and can therefore be employed for numerous application possibilities, in particular for the preparation of lithographic plates, silkscreen stencils and photoresists.

In such applications, the photosensitive layers contain about 10 to 90, preferably about 20 to 75% by weight of the polymers according to the invention.

As negative-working light-hardenable substances it is possible to employ virtually all the known compounds provided they are compatible with the polymeric matrix.

For example, diazonium salt polycondensation products, particularly condensation products of aromatic diazonium salts capable of condensation with aldehydes, more particularly condensation products of diphenylamine-4-diazonium salts with formaldehyde, are very highly suitable. Advantageously, co-condensation products are, however, employed which, in addition to the diazonium salt units, contain further, non-photosensitive units which are derived from compounds capable of condensation, for example aromatic amines, phenols, phenol ethers, aromatic thioethers, aromatic hydrocarbons, aromatic heterocyclic compounds or organic acid amides. Such condensation products are disclosed in U.S. Pat. Nos. 3,867,147, 3,679,419 and 3,849,392. Generally, however, all the diazonium salt condensates are suitable which are described in German Offenlegungsschrift No. 2,739,774. The quantitative proportion of the diazonium salt polycondensation product in the mixture is, in general, between about 5 and 60, preferably between about 10% and 40% by weight, referred to the total content of nonvolatile constituents.

Further particularly advantageous polycondensation products are obtained by condensing an optionally substituted diphenylamine diazonium salt, first with an aromatic compound R'—O—CH2—B and then with an aromatic compound R'—O—CH2—B—CH2—O—R', R' being a hydrogen atom, an alkyl or aliphatic acyl radical and B being the radical of one of the above listed compounds capable of condensation. These condensation products are described in European Patent Application No. 126,875. Photopolymerizable mixtures composed of a polymerizable monomer or oligomer and photoinitiators can also advantageously be employed as photosensitive constituents in the mixture according to the invention, in particular in the field of application of printed circuits.

Suitable polymerizable compounds are, for example, disclosed in U.S. Pat. Nos. 2,760,683 and 3,060,023. Examples are acrylic or methacrylic acid esters of polyhydric alcohols such as trimethylolpropane triacrylate, polyethylene glycol diacrylate, neopentyl glycol diacrylate, 2,2-dimethylolbutan-3-ol diacrylate, pentaerythritol trior tetraacrylate and also the corresponding methacrylates. Furthermore, acrylates or methacrylates which contain urethane groups, and also acrylates or methacrylates of polyesters containing hydroxyl groups are suitable. Finally, prepolymers containing allyl or vinyl groups are suitable, in particular, monomers or oligomers being preferred which contain at least two polymerizable groups per molecule. The polymerizable compounds may, in general, be contained in a quantity of about 5 to 50, preferably about 10% to 35% by weight, referred to the nonvolatile constituents, in the mixture according to the invention.

Numerous substances may be used in the photosensitive mixture according to the invention as photoinitiators. Examples are benzoins, benzoin ethers, polynuclear quinones such as 2-ethylanthraquinone, acridine derivatives such as 9-phenylacridine or benzoacridines, phenazine derivatives such as 9,10-dimethylbenz[a]phenazine, quinoxaline or quinoline derivatives such as 2,3-bis(4-methoxyphenyl)quinoxaline or 2-styrylquinoline, quinazoline compounds or acylphosphine oxide compounds. Photoinitiators of this type are described in German Patent Nos. 2,027,467, 2,039,861 and European Patent No. 11,786. In addition, for example, hydrazones, mercapto compounds, pyrylium and thiopyrylium salts, synergistic mixtures with ketones or hydroxyketones and dyestuff redox systems may be suitable. Particularly preferred are photoinitiators which have trihalomethyl groups which can be cleaved by light, in particular suitable compounds from the triazine or thiazoline series. Such compounds are described in German Offenlegungsschriften Nos. 2,718,259, 3,333,450 and 3,337,024. The photoinitiators are in general added in quantitative proportions of about 0.1 to 15, preferably of about 0.5% to 10% by weight, referred to the nonvolatile constituents of the mixture.

For certain applications low- or high-molecular weight azido derivatives are particularly suitable as photosensitive compounds, low-molecular weight azido compounds containing at least two azido groups per molecule being preferred. As examples, mention may be made of 4,4'-diazidostilbenes, 4,4'-diazidobenzophenones, 4,4'-diazidobenzalacetophenones, 4,4'-diazidobenzalacetones or 4,4'-diazidobenzalcyclohexanones. The photosensitivity of such azido compounds may optionally be intensified by using suitable sensitizers, for example 1,2-benzanthraquinone. Furthermore, those polyfunctional azides are also suitable whose individual absorption has been displaced by conjugation with double bonds in the molecule in a manner such that no additional sensitization is necessary in the exposure. Further suitable azido compounds are known from British published application No. 790,131, German Patent No. 950,618 and U.S. Pat. No. 2,848,328. The quantitative proportion of the azido derivative in the mixture is in general between about 5 and 60, preferably between about 10% and 40% by weight, referred to the total content of nonvolatile constituents. Finally, low-molecular diazo compounds such as p-quinonediazide or p-iminoquinonediazide can be used as photosensitive compounds. Such mixtures are, however, because of the low photosensitivity, not preferred. The quantity of the low-molecular diazo compounds may in general be about 5 to 60, preferably about 10% to 40% by weight, referred to the nonvolatile constituents of the mixture.

The mixtures according to the invention can be processed in a known manner corresponding to their application. For this purpose, the polymeric reaction product is dissolved in a suitable solvent or solvent mixture from which the coating is intended to take place, for example ethylene glycol monoethyl ether, ethylene glycol monoacetate, dioxane, tetrahydrofuran or butanone, and a photosensitive substance soluble in this mixture is added to it.

Furthermore, depending on the nature of the photosensitive compounds, the following additives may be added to the photosensitive coating solution:

(a)
in the case of sensitization with diazo compounds, for example, p-quinonediazides or diazonium salt condensation products:

a dyestuff to render the photosensitive layer visible on the base material; an acid, preferably phosphoric acid, to stabilize the diazonium salt, and a contrast former which effects an intensification of the color change in the layer during exposure.

(b)
in the case of sensitization with azido compounds:

a dyestuff to render the photosensitive layer visible and to enhance the sensitivity of the photocrosslinking compound in the desired spectral region.

(c)
in the case of sensitization with photopolymerizable substances:

inhibitors which suppress the thermal polymerization, or hydrogen donors.

In addition, plasticizers, pigments, further resin components, etc. may be added to the photosensitive mixture. For further processing, the solutions obtained are filtered in order to remove constituents which may not be dissolved, and applied in a manner known, per se, for example, with a doctor blade or by spinning, to a suitable base material and dried. Suitable base materials are, for example, aluminum which has been grained mechanically or electrochemically and optionally anodized and post-treated, aluminum clad films or other hydrophilized films, films coated with copper by vapor deposition or multimetal foils. The nature of the application depends to a large degree on the desired layer thickness of the photosensitive layer, the layer thicknesses of the dried layer in general being between about 0.5 and 200 μm.

After adequate drying, the materials can be converted into their respective application form in a manner known, per se by exposure to an image by means of a negative film master or, with suitable sensitization, by means of a laser beam and subsequent development. In this case, the development can be carried out with water, aqueous solutions which optionally contain small quantities of an organic salt and/or tenside or with aqueous alkali solutions. The type of development preferred in each case depends on the composition of the photosensitive mixture, on the hydroxyl number of the polymer according to the invention and on the application. Those photosensitive mixtures are preferred which can be processed with developers which contain (a) an alkali-metal salt of an aliphatic or araliphatic sulfonic acid,
(b) an alkali-metal borate,
(c) an alkali-metal phosphate and
(d) optionally an alkali-metal salt of an organic aromatic carboxylic acid, for example benzoic acid.

In some cases it is beneficial to treat the exposed and developed mixture with a preservative.

The layer can be additionally consolidated by a thermal post-treatment, which is expedient, in particular, in lithographic printing plate applications. For this purpose, the preserved printing plate is heated to temperatures between about 180° C. and 240° C. The duration of this treatment depends on the temperature and varies between 2 and 20 minutes.

This thermal post-treatment differs from the post-treatments of a similar nature described previously insofar as it does not require any addition of a crosslinking agent. It is assumed that the polymers according to the invention eliminate water under these conditions and are converted into polymers with unsaturated side groups which are available for an additional photochemical or thermal crosslinking. It may therefore be expedient to add, additionally, a thermal crosslinker to the photosensitive mixture, for example, an organic peroxide with a scorch temperature of at least 100° C. which is capable above said temperature of forming radicals. Suitable peroxides are peroxy esters, peroxy ketals, bisaralkyl peroxides, dialkyl peroxides and bisdialkyl peroxides. This thermal post-treatment considerably improves the ink receptivity behavior of the photosensitive layer, especially if those polymers are employed which have a high hydroxyl number.

The mixtures according to the invention make it possible to prepare lithographic printing plates which are notable for relatively high print runs, good reproduction properties and storage stability meeting practical requirements. They can be processed easily and without staining using developer solutions which are virtually environmentally neutral. As a result of the thermal post-treatment described above, a substantial increase in the resistance to abrasion can be achieved. Furthermore, they make it possible to prepare resist stencils with excellent resolution which have an adequate thermal stability and guarantee an adequate storage stability. In this case, too, very mild, low toxicity or nontoxic developer solutions can be used. Finally, the preparation of silkscreen stencils may also be mentioned as a field of application. Here, too, the beneficial processing characteristics and the good storage stability of the mixture are particular advantages.

The examples below are intended to explain the invention and its application possibilities in more detail. Parts by weight (pbw) and parts by volume (pbv) are in the relationship of g/cm$^3$; percentages and quantitative ratios are, unless otherwise specified, to be understood in parts by weight.

PREPARATION EXAMPLE 1

Acetaldol (3-hydroxybutanal) is prepared by alkali-catalyzed condensation of acetaldehyde (cf. Organikum, VEB Deutscher Verlag der Wissenschaften, Berlin, 15th edition, 1977, page 566) and stabilized by adding a small quantity of water.

44 pbw of polyvinyl alcohol (12% residual acetyl groups; K value 8) are introduced into 300 pbv of ethanol. The mixture is stirred with a stirrer at 450 revolutions per minute. In addition, 26.2 pbw of acetaldol, 14.4 pbw of butanal and 0.3 pbw of 2,6-di-t-butylcresol (ionol) are added. 0.5 pbw of sulfuric acid is added to this mixture while stirring and it is heated to reflux. Under these conditions, the polyvinyl alcohol is solubilized. After 4 hours, 5.0 pbw of butanal are again added, and the mixture is heated for a further 3 hours to reflux. 300 pbv of ethanol are added to the cooled solution and precipitation is carried out in 10,000 pbw of demineralized water. An amorphous fibrous white product which contains 60.9% C and 9.5% H and has the OH number 373 is obtained.

PREPARATION EXAMPLE 2

5-hydroxypentanal is prepared by acid-catalyzed cleavage of 2,3-dihydropyran (cf. Org. Synth., Coll. Vol. III, page 470).

44 pbw of the polyvinyl alcohol specified in Preparation Example 1 are dissolved in 340 pbv of water while hot. 36.7 pbw of 5-hydroxypentanal and 6.5 pbw of butanal and also 0.3 pbw of 2,6-di-t-butylcresol are added to the cooled, well stirred solution. A solution of 80 pbv of distilled water, 7 pbv of concentrated hydrochloric acid and 0.5 pbw of sodium octyl sulfate is added dropwise to this mixture. The mixture is stirred for one hour at room temperature, during which process it becomes turbid and the polymeric reaction product starts to precipitate in the form of a grainy precipitate. The mixture is heated to 40° C. and left at this temperature for two hours, then 20 pbv of concentrated hydrochloric acid are allowed to flow in, and it is stirred for a further two hours at 40° C. and allowed to cool to room temperature while stirring. The supernatant solution is decanted off, the product is washed with a considerable amount of water and then dissolved in a mixture of 350 bpv of ethylene glycol monomethyl ether and 200 pbv of tetrahydrofuran. The clear solution is added dropwise to 10,000 pbv of water which contains 3% by weight of sodium hydrogensulfite. The precipitated product is isolated by filtration, washed well with water and dried. 70 pbw of a white, fibrous polymer is obtained which contains 58.9% C and 9.2% H and has the OH number 338.

PREPARATION EXAMPLE 3

3-hydroxypentanal is prepared by alkali-catalyzed reaction of acetaldehyde with propionaldehyde.

44 pbw of polyvinyl alcohol (2% residual acetyl groups; K value 10) are reacted with 29 pbw of 3-hydroxypentanal and 16 pbw of propanal as in Preparation Example 1. A somewhat brittle, white, fibrous material is obtained in a yield of 82 pbw with the OH number 292.

PREPARATION EXAMPLE 4

4-hydroxybutanal is prepared from 2,3-dihydrofuran. 44 pbw of polyvinyl alcohol (12% residual acetyl groups; K value 4) are reacted with 18.6 pbw of 4-hydroxybutanal and 19.4 pbw of acetaldehyde as in Preparation Example 2. In this case, initially all the hydroxybutanal is taken and only 30% of the acetaldehyde. The remainder of the acetaldehyde is only added when the mixture of acid and sodium octyl sulfate has been completely added dropwise and a first indication of turbidity of the reaction mixture becomes visible. 76 pbw of a white, fibrous product which has the OH number 244 and contains 59.2% C and 9.0% H is obtained.

PREPARATION EXAMPLE 5

2-Methyl-3-hydroxypentanal is prepared from propionaldehyde. 44 pbw of polyvinyl alcohol (2% residual acetyl groups; K value 4) are reacted with 30 pbw of 2-methyl-3-hydroxypentanal and 15 pbw of benzaldehyde as in Preparation Example 1. A fibrous, white polymer with the OH number 302 is obtained.

PREPARATION EXAMPLE 6

As in Preparation Example 1, 44 pbw of the polyvinyl alcohol specified in Preparation Example 1 are reacted with 29 pbw of 3-hydroxybutanal and 7.4 pbw of methyl 4-formylbenzoate. After the reaction is terminated, the mixture is allowed to cool and 25 pbv of 30% sodium hydroxide is added to it dropwise. Stirring is continued for one hour at room temperature, dilution is carried out with 350 pbv of ethanol and the mixture is added dropwise to 10,000 pbw of 0.01N aqueous HCl. The precipitated fibrous polymer is siphoned off, amply washed until neutral with water and dried. A polymer with the acid number 29 and the OH number 470 is obtained.

PREPARATION EXAMPLE 7

The polyvinyl alcohol of Preparation Example 1 is reacted with acetaldol and butanal in the quantitative ratios specified in that case, the reaction conditions of Preparation Example 2, however, being used. The product obtained is produced in 95% yield and contains 60.8% C and 9.3% H. It has the OH number 359.

PREPARATION EXAMPLE 8

As in Preparation Example 1, 44 pbw of polyvinyl alcohol of Preparation Example 1 is reacted with 26 pbw of butanal and 9 pbw of 5-hydroxypentanal. The polymer obtained contains 62.5% C and 9.5% H and has the OH number 219.

PREPARATION EXAMPLE 9

A mixture of 32 pbw of the polyvinyl alcohol, specified in Preparation Example 1, and 12 pbw of polyvinyl alcohol, containing 12% residual acetyl groups and having the K value 18, is reacted with 17.6 pbw of 3-hydroxybutanal and 3.6 pbw of butanal as described in Preparation Example 2. The polymer obtained has the OH number 426 and contains 60.5% C and 9.5% H.

PREPARATION EXAMPLE 10

44 pbw of polyvinyl alcohol (2% residual acetyl groups; K value 8) are reacted with 20 pbw of 3-hydroxypentanal and 10 pbw of 4-chlorobenzaldehyde as in Preparation Example 2. A polymer with the OH number 252 and a chlorine content of 2.7% is obtained.

PREPARATION EXAMPLE 11

By reacting bromoacetaldehyde diethyl acetal with phenol, 2-phenoxyacetaldehyde diethyl acetal is prepared, which is converted by acidic hydrolysis into the aldehyde. 44 pbw of the polyvinyl alcohol specified in Preparation Example 5 are reacted with 15 pbw of 3-hydroxyhexanal and 25 pbw of the aldehyde described above as in Preparation Example 1. The polymer obtained has the OH number 187 and contains 63.2% C and 8.9% H.

PREPARATION EXAMPLE 12

As in Preparation Example 2, after introducing the acid, 18 pbw of a 37% aqueous formaldehyde solution are added dropwise to 44 pbw of the polyvinyl alcohol specified in Preparation Example 5. After completion of the dropwise addition, 22 pbw of 2,2-dimethyl-3-hydroxybutanal are added to the mixture and the further procedure is as specified in Preparation Example 2. A brittle product with the OH number 274 is obtained.

PREPARATION EXAMPLES 13 and 14

The benzaldehyde of Preparation Example 5 is replaced by the same quantity of a mixture of equal parts of 4-methylbenzaldehyde and 4-methoxybenzaldehyde. The polymers obtained have OH numbers around 270 and are very similar in their properties to the polymer of preparation example 5.

PREPARATION EXAMPLE 15

2-Methyl-2-methylolpropanal is prepared from formaldehyde and 2-methylpropanal. 44 pbw of the polyvinyl alcohol specified in Preparation Example 1 are reacted with 24 pbw of 2-methyl-2-methylolpropanal and 16 pbw of butanal as in Preparation Example 2. The precipitated polymer obtained is stable when stored below 30° C. It has the OH number 322.

PREPARATION EXAMPLE 16

44 pbw of the polyvinyl alcohol specified in Preparation Example 5 are reacted with 46 pbw of 5-hydroxypentanal and 2 pbw of butanal as in Preparation Example 1. The polymer has the OH number 442.

PREPARATION EXAMPLE 17

2-ethyl-3-hydroxyhexanal is prepared by alkali-catalyzed condensation of n-butanal. 22 pbw of the polyvinyl alcohol specified in Preparation Example 5 and 22 pbw of the polyvinyl alcohol specified in Preparation Example 4 are reacted with 20 pbw of 2-ethyl-3-hydroxyhexanal and 8 pbw of propanal. The polymer has the OH number 324.

APPLICATION EXAMPLE 1

A coating solution composed of
3.5 pbw of the polymer described in Preparation Example 1,
1.2 pbw of a diazonium salt polycondensation product prepared from 1 mol of 3-methoxydiphenylamine-4-diazonium sulfate and 1 mol of 4,4'-bis-(methoxymethyl)diphenyl ether in 85% phosphoric acid and isolated as mesitylene sulfonate,
0.14 pbw of phosphoric acid (85%)
0.18 pbw of Victoria pure blue FGA (C.I. Basic Blue 81) and
0.04 pbw of phenylazodiphenylamine in
165 pbw of ethylene glycol monomethyl ether and
32 pbw of tetrahydrofuran
is applied to a 0.3 mm thick aluminum foil, which has been grained by brushing with an aqueous abrasive suspension and then pretreated with a 0.1% aqueous solution of polyvinylphosphonic acid, and then dried.

The photosensitive layer thus obtained, which has a layer weight of 0.6 g/m$^2$, is exposed under a standard negative master for 18 seconds using a metal-halide lamp with a power of 5kW. The exposed layer shows a clear contrast between the exposed and unexposed areas and is treated with a developer solution of the following composition:

3.0 pbw of sodium octyl sulfate,
4.2 pbw of sodium benzoate,
2.8 pbw of trisodium phosphatedodecahydrate,
1.5 pbw of monosodium dihydrogenphosphate,
88.5 pbw of demineralized water, whose pH is 7.3, the unexposed layer regions being cleanly removed within a short time, and then rinsed off with water and dried. The finest elements of the master are reproduced in the copy. The printing plate obtained in this way yields a print run of more than 50,000 sheets on a sheet-fed offset machine.

APPLICATION EXAMPLE 2

A coating solution consisting of
92.2 pbw of the binder described in Preparation Example 1,
31.9 pbw of the diazonium polycondensate described in Application Example 1 but which has been isolated as methane sulfonate,
3.85 pbw of phosphoric acid (85%),
4.73 pbw of Victoria pure blue FGA and
1.1 pbw of phenylazodiphenylamine in
4,600 pbw of ethylene glycol monomethyl ether
is applied to the layer base described in Application Example 1. The dry layer weight is 0.55 g/m$^2$.

The exposure is carried out as in Application Example 1, while, for the purpose of development, the film is rinsed with water and wiped over with a plush pad soaked in water. The non-image areas can be removed without difficulty and, after preservation with an aqueous solution which contains 3% polystyrene sulfonic acid, a highly ink-receptive printing plate whose non-image areas do not absorb any oily ink is obtained. During a print run in a sheetfed offset machine, a few thousand good impressions are obtained.

APPLICATION EXAMPLE 3

A coating solution is prepared from
2 pbw of the polymer described in Preparation Example 1,
2.2 pbw of the reaction product of 1 mol of 2,2,4-trimethylhexamethylene diisocyanate and 2 mols of hydroxyethyl methacrylate,
0.1 pbw of 9-phenylacridine,
0.1 pbw of the azodyestuff obtained from 2,4-dinitro-6-chlorobenzenediazonium salt and 2-methoxy-5-acetylamino-N-cyanoethyl-N-hydroxyethylaniline in
26 pbw of butanone and
14 pbw of butylacetate.

The solution is applied to an aluminum foil grained electrochemically in nitric acid, anodized in sulfuric acid and post-treated with polyvinylphosphonic acid in a manner such that a dry layer weight of 3.2 g/m$^2$ is obtained. The layer is then coated with a 0.4 μm thick layer of polyvinyl alcohol to protect its surface.

The finished plate is exposed for 20 seconds using a 5 kW metal-halide lamp at a distance of 130 cm between copying frame and lamp under a continuous-tone step wedge with a density range from 0.05 to 3.05 and density increments of 0.15. The development is carried out with a developer of the following composition:

1 pbw of NaOH,
4 pbw of pelargonic acid, 12 pbw of an ethylene oxide/propylene oxide copolymer,
4 pbw of sodium tetrapolyphosphate and
79 pbw of water.

The rapidly developable plate exhibits a solid step 4. After being clamped in a sheet-fed offset machine, 125,000 good impressions are obtained.

APPLICATION EXAMPLE 4

A coating solution is prepared from s
2.1 pbw of the polymer described in Preparation Example 2,
2.2 pbw of 2,6-bis(4-azidobenzal)-4-methylcyclohexanone,
0.3 pbw of rhodamine 6 GDN extra (C.I. 45160) in
120 pbw of ethylene glycol monomethyl ether and
30 pbw of butanone.

The solution is applied to the layer base described in Application Example 3 and dried to give a dry layer weight of 0.7 g/m$^2$. After exposure, a readily visible dark-red image is obtained. The layer is treated by means of a plush pad with a developer solution composed of 5.0 pbw of sodium lauryl sulfate and
1.0 pbw of sodium metasilicate pentahydrate in
94.0 pbw of demineralized water,
the non-image areas being removed. 156,000 good impressions are obtained in a sheet-fed offset machine.

APPLICATION EXAMPLE 5

After exposure, development and preservation with a commercial preserving agent, the layer of the previous example is heated at 230° C. in a hot box for 5 minutes. Compared directly with the plate of the previous example, this plate prints an additional 110,000 impressions.

APPLICATION EXAMPLE 6

A coating solution composed of
30.3 pbw of the polymer described in Preparation Example 5,
15.1 pbw of the diazonium salt polycondensation product described in Application Example 1,
1.2 pbw of phosphoric acid (85%),
1.5 pbw of Victoria pure blue FGA (C.I. Basic Blue 81) and
1.1 pbw of phenylazodiphenylamine in
1,600 pbw of ethylene glycol monomethyl ether
is applied by spinning to an aluminum foil grained electrolytically in hydrochloric acid, then anodized and post-treated with polyvinylphosphonic acid. The layer weight of the dried layer is 1.2 g/m$^2$.

The exposure and development is carried out as specified in Application Example 1.

The printing plate obtained prints a print run of 150,000 sheets in a sheet-fed offset machine without any significant wear of the copy being visible.

APPLICATION EXAMPLE 7

From
6.5 pbw of the reaction product described in Preparation Example 7,
5.6 pbw of a technical mixture of pentaerythritol tri-and tetraacrylate,
0.2 pbw of 2-(4'-methoxystyryl)-4,6-bistrichloromethyl-s-triazine and
0.03 pbw of the azodyestuff specified in Application Example 3 in
25 pbw of butanone,
2 pbw of ethanol and
1 pbw of butyl acetate,
a solution is prepared which is spun onto a biaxially oriented and heat-set polyethylene terephthalate film 25 μm thick in a manner such that a dry layer weight of 35 g/m$^2$ is obtained after drying at 100° C.

The dry resist film obtained in this manner is laminated onto a phenolic plastic laminated plate clad with 35 μm thick copper foil using a laminating device at 120° C. and is then exposed for 25 seconds using a commercial exposure unit. The master used is a line master with line widths and spacings down to 80 μm. After exposure, the polyester film is slowly peeled off and the layer obtained developed with a developer solution of the composition specified in Application Example 1 in a spray development unit for 90 seconds. This is followed by a 30 second rinse with tap water, 30 seconds initial etching in a 15% ammonium peroxydisulfate solution and then electroplating in the following electrolytic baths:

(1) 30 minutes in a copper bath of the type "bright-copper bath" supplied by Schloetter, Geislingen/Steige.
Current density: 2.5 A/dm$^2$
Metal build-up: approx. 12.5 μm.
(2) 10 minutes in a nickel bath of the type "Norma" supplied by the same manufacturer.
Current density: 4.0 A/dm$^2$.
Metal build-up: 9 pμm.

The plate exhibits no damage or undercutting. The stripping is carried out in 5% KOH solution at 50° C. The exposed copper is etched away with the usual etching media.

APPLICATION EXAMPLE 8

A coating solution of the following composition is prepared:
1.5 pbw of the polymer described in Preparation Example 9,
0.5 pbw of a diazonium salt polycondensation product of 1 mol 3-methoxydiphenylamine-4-diazonium sulfate and 1 mol each of 4-methoxymethyl-4'-methyldiphenyl ether and 1,4-bismethoxymethyl-benzene precipitated as 2-hydroxy-4-methoxybenzophenone-5-sulfonate,
0.1 pbw of Victoria pure blue FGA,
1.5 pbw of a technical mixture of pentaerythritol tri-and tetraacrylate,
0.1 pbw of 2-(4'-styrylphenyl)-4,6-bistrichloromethyl-s-triazine and
0.05 pbw of phosphoric acid (85%) in
48 pbw of ethylene glycol monomethyl ether and
42 pbw of butanone.

This solution is applied to an aluminum plate grained electrochemically, anodized and post-treated with polyvinylphosphonic acid and dried to a dry layer weight of 1.6 g/m$^2$. The printing plate obtained is exposed under a suitable test master and developed with a developer of the following composition:

3.5 pbw of disodium hydrogenphosphatedodecahydrate,
3.5 pbw of trisodium phosphatedodecahydrate, 1.5 pbw of potassium tetraboratetetrahydrate and
2.5 pbw of sodium dodecyl sulfate in
89.0 pbw of demineralized water.

The printing plate absorbs oily ink immediately in the sheetfed offest machine. Even after a prolonged machine stoppage, the ink is already fully accepted again after 2–8 sheets. The print run achieved is approx. 180,000 satisfactory impressions, even the finest lines still being reproduced in full.

APPLICATION EXAMPLE 9

0.2 pbw of 2,5-dimethylhexane-2,5-di-t-butyl peroxide as a 45% granular material with chalk is additionally incorporated into the coating solution of the previous example and the solution is filtered before coating. The developed printing plate is treated with a commercial preservative and heated for 5 minutes at 210° C. The plate thermally post-treated in this way still exhibits no damage of any kind even after 300,000 sheets.

APPLICATION EXAMPLE 10

The storage stability of the layer described in Application Example 6 is tested. For this purpose, 5 plates of the photosensitive mixture described there are prepared and they are stored for 1 to 5 hours in a drying oven at 100° C. After the thermal storage, the plates are exposed to an image and developed with the developer described in Application Example 1. To render visible the layer residues (scum) left in the non-image areas, the dried plates are inked with protective ink.

The plates stored for one and two hours can still be developed satisfactorily. They do not exhibit any appreciable extension of the continuous-tone step wedge. After hot storage for three hours the layer exhibits an extension of the continuous-tone step wedge by a good two steps. The development is delayed only slightly. The plate stored for four hours can be developed only with a marked delay and with the formation of flakes. The plate stored for five hours scums and the layer can no longer be detached satisfactorily from the layer base at any point. The results show that the mixtures according to the invention are relatively resistant to hot storage.

APPLICATION EXAMPLES 11 to 16

The examples below are intended to demonstrate that the photosensitive layers according to the invention are easier to process with aqueous developers, compared with those which contain commercial polyvinyl acetals with, for the most part, lower hydroxyl numbers, and, in addition, at the same time exhibit properties in copying and printing work which are superior, or at least equivalent, to those of the comparative examples.

For this purpose, 6 coating solutions are prepared which differ only in the polymers used:

3.6 pbw of the particular polymer,
1.8 pbw of the diazonium salt polycondensation product described in Application Example 1,
0.2 pbw of phosphoric acid (85%),
0.1 pbw of crystal violet (C.I. 42555) and
0.06 pbw of phenylazodiphenylamine in
150 pbw of ethylene glycol monomethyl ether.

The polymers used in each case, their OH numbers and also the development capability, resolution, ink receptivity, print run and print run after heat post-treatment of the corresponding photosensitive layers are shown in Table 1 below. All the layers are applied to an aluminum base roughened up electrolytically in nitric acid, anodized and post-treated with polyvinyl phosphonic acid to give a dry layer weight of 1.0 g/m².

TABLE 1

| | Example | | | | | |
|---|---|---|---|---|---|---|
| | 11 | 12 | 13 (V) | 14 (V) | 15 (V) | 16 (V) |
| Binder (a) | A | B | C | D | E | F |
| Molecular weight | 90,000 | 90,000 | 85,000 | 85,000 | 85,000 | 30,000 |
| OH number | 373 | 426 | 300 | 220 | 160 | 85 |
| Developer | | | | | | |
| No. 1 (b) | + | + | − | − | − | − |
| No. 2 (c) | + | + | − | − | − | − |
| No. 3 (d) | + | + | + | (+) | − | − |
| No. 4 (e) | (+) | (+) | (+) | (+) | + | + |
| Ink receptivity | good | good | good | good | good | good |
| Resolution (f) | " | " | " | " | " | " |
| Print run | 140,000 | 160,000 | 120,000 | 120,000 | 120,000 | 220,000 |
| Print run (W) | 230,000 | 220,000 | 120,000 | 100,000 | 100,000 | 230,000 |

Explanatory notes:
(a) A = polymer from Preparation Example 1
　　B = polymer from Preparation Example 9
　　C–E = commercial polyvinyl butyral
　　F = commercial polyvinyl formal
(b) developer as in Application Example 1
(c) developer composition:
　　1 pbw of NaOH,
　　4 pbw of pelargonic acid,
　　12 pbw of ethylene oxide/propylene oxide copolymer,
　　4 pbw of sodium tetrapolyphosphate,
　　79 pbw of water.
(d) developer composition:
　　0.2 pbw of sodium metasilicate nonahydrate,
　　4 pbw of disodium hydrogenphosphate dodecahydrate,
　　3.5 pbw of trisodium phosphate dodecahydrate,
　　1.5 pbw of potassium tetraborate tetrahydrate,
　　2 pbw of potassium oxalate monohydrate,
　　2.5 pbw of sodium benzoate,
　　2 pbw of phenoxy ethanol,
　　84.3 pbw of water.
(e) developer composition:
　　2.8 pbw of sodium sulfate decahydrate,
　　2.8 pbw of magnesium sulfate heptahydrate,
　　0.9 pbw of orthophosphoric acid,
　　0.08 pbw of phosphorous acid,
　　1.6 pbw of nonionic wetting agent,
　　10 pbw of benzyl alcohol,
　　20 pbw of n-propanol,
　　61.82 pbw of water.
(b)–(e)
　+ = developer highly suitable,
　− = developer not suitable since there is no layer differentiation,
　(+) = developer not very suitable since either layer differentiation is poor or exposed layer is attacked.
(f) Resolution of the fields from 2 to 98% surface coverage in the 60 lines/cm screen of a standard half-tone step wedge after 20 seconds exposure and development with the developer suitable in each case.
(V) Comparative example
(W) Print run after heat treatment for 5 minutes at 230° C.

From these examples, it emerges that, in contrast to the mixtures of the comparative examples, the photosensitive mixtures according to the invention can easily be developed with aqueous solutions. The former can only be processed with aqueous alkaline, in general solvent-containing developers. The layer containing polyvinyl formal can be processed only with a developer which contains a high proportion of solvent. The layers according to the invention are equivalent in copying work to those of the comparative examples and are either superior to or at least equivalent to the latter in their print run.

APPLICATION EXAMPLE 17

A coating solution is prepared from
2.2 pbw of the polymer described in Preparation Example 9,
2.2 pbw of 4,4'-diazidostilbene-2,2'-disulfonic acid,
0.3 pbw of rhodamine 6 GDN extra and
0.2 pbw of 2-benzoylmethylene-1-methyl-b-naphthothiazoline in
100 pbw of ethylene glycol monomethyl ether,
30 pbw of tetrahydrofuran and
20 pbw of water.
The solution is applied to the base described in the Application Example 3 and dried to a dry layer weight of 0.8 g/m². The copying layer is exposed for 35 seconds under a negative master using a metal-halide lamp with a power of 5 kW. The layer is developed with a solution of
5 pbw of sodium lauryl sulfate and
95 pbw of water
by wiping it over with a plush pad, the non-image areas being removed. 175,000 qualitatively good impressions are achieved on the sheet-fed offset machine.

APPLICATION EXAMPLE 18

The coating solution described in the Application Example 1 is spun onto the base described in the Application Example 3. The layer weight is about 1 g/m² after drying. Four plates of this type are stored in a tropical chamber which is heated to 40° C. and has a relative humidity of 60%. In each case one plate is removed after 1, 2, 4 and 8 months, exposed to an image and developed as described in the Application Example 1. As a comparison, a plate not subjected to these conditions is included.

The plates stored for 1 and 2 months correspond completely to the original plate. They can be developed equally as quick and without background staining. The plate stored for 4 months shows a marked elongation of the continuous-tone step wedge. The plate stored for 8 months also shows traces of tone in the non-image areas. For a layer which can be developed with aqueous solutions, such storage stability is surprisingly high.

APPLICATION EXAMPLE 19

A coating solution composed of 6.5 pbw of the polymer described in the Preparation Example 6,
5.5 pbw of 4,4'-bis(-acryloyloxyethoxy)diphenyl ether,
0.2 pbw of 2-(4'-methoxystyryl)-4,6-bistrichloromethyl-s-triazine and
0.2 pbw of the azodyestuff specified in the Application Example 3 in
250 pbw of butanone,
2 pbw of ethanol and
1 pbw of butyl acetate
is further processed as described in the Application Example 7. This plate, also exhibits no damage or undercutting.

APPLICATION EXAMPLE 20

A degreased polyester screen (mesh size 0.05 mm) is coated with the following coating solution:
4.5 pbw of the polymer described in the Preparation Example 5,
2.0 pbw of dipentaerythritol pentaacrylate,
2.0 pbw of a urethane acrylate, prepared by reacting 1 mol of toluene-2,4-diisocyanate with 2 mol of hydroxyethyl methacrylate and
0.4 pbw of 2-(4-ethoxynaphth-1-yl)-4,6-bistrichloromethyl-s-triazine in
92 pbw of ethylene glycol monomethyl ether.

The dried screen is exposed through a photo mask and processed with the developer specified in Application Example 1. The silk-screen printing stencil obtained shows a good image resolution and resistance to abrasion.

I claim:
1. A photosensitive mixture comprising:
(A) a negative-working light-hardenable substance selected from the group consisting of:
(1) a diazonium salt polycondensation product containing diazonium salt units and non-photosensitive units derived from compounds capable of condensation and selected from the group consisting of aromatic amines, phenols, phenol ethers, aromatic thioethers, aromatic hydrocarbons, aromatic heterocyclic compounds and organic acid amides, and
(2) a mixture of olefinically unsaturated, radically polymerizable compound and a photoinitiator for radical polymerization
in admixture with
(B) a polyvinyl acetal having a hydroxyl number of from 150 to 600,
wherein the light-hardenable substance and the polyvinyl acetal are present in amounts sufficient to produce an image when exposed to actinic radiation and developed wherein the polyvinyl acetal is a compound of the formula

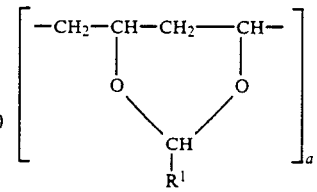

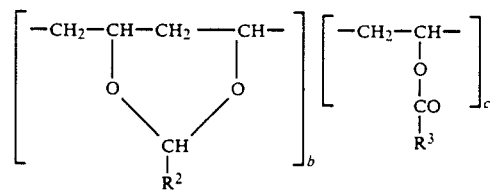

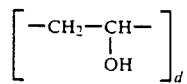

wherein
R¹ is a radical selected from the group consisting of

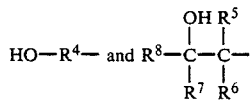

R² is a hydrogen atom, a substituted or unsubstituted alkyl radical containing 1 to 6 carbon atoms, or a substituted or unsubstituted aryl radical, R³ is an alkyl radical containing 1 to 4 carbon atoms, R⁴ is a substituted or unsubstituted alkylene group containing 1 to 6 carbon atoms, R⁵ and R⁶ are identical or different and denote hydrogen atoms, alkyl radicals containing 1 to 6 carbon atoms, alkoxy radicals containing 1 to 4 carbon atoms, or hydroxyalkyl radicals containing 1 to 3 carbon atoms or hydroxyl groups, R⁷ is a hydrogen atom or an alkyl radical containing 1 to 6 carbon atoms, R⁸ is a hydrogen atom, an alkyl, hydroxyalkyl or alkoxyalkyl radical containing 1 to 6 carbon atoms or a substituted or unsubstituted aryl radical containing 6 to 10 carbon atoms, a is a number from 0.05 to 0.8, b is a number from 0.2 to 0.6, c is a number from 0.01 to 0.15, d is a number from 0.04 to 0.2, and the sum of a+b+c+d=1.

2. Photosensitive copying material with a layer base and a photosensitive layer, wherein the photosensitive layer comprises a mixture as claimed in claim 1.

3. A photosensitive mixture as claimed in claim 1, wherein

R¹ comprises from 1 to 3 hydroxyl groups;

R² is a substituted or unsubstituted alkyl radical of 1 to 4 carbon atoms, wherein said substituents are selected from the group consisting of halogen, aryl, aryloxy, and alkoxy, said aromatic substituents having from 6 to 8 carbon atoms, and said aliphatic substituents having from 1 to 3 carbon atoms; or a substituted or unsubstituted mononuclear aryl radical, wherein said substituents are selected from the group consisting of halogen, alkyl alkoxy and carboxylic acid ester, said aryl radical with substituents having no more than 10 carbon atoms;

R³ is a methyl radical;

R⁴ is a substituted or unsubstituted alkylene group of 2 to 5 carbon atoms, wherein said substituents are selected from the group consisting of halogen and alkoxy;

R⁵ and R⁶ are hydrogen, alkyl radicals containing 1 to 4 carbon atoms, or hydroxymethyl radicals;

R⁷ is hydrogen;

R⁸ is hydrogen, an alkyl radical of 1 to 4 carbon atoms, or a hydroxyalkyl or alkoxyalkyl radical of 1 to 4 carbon atoms.

4. A photosensitive mixture as claimed in claim 3, wherein R¹ comprises from 1 to 2 hydroxyl groups.

5. A photosensitive mixture as claimed in claim 1, wherein the mean molecular weight is about 20,000 to 100,000.

6. A lithographic printing plate comprising the photosensitive mixture of claim 5.

7. A photosensitive mixture as claimed, in claim 1, wherein the mean molecular weight is below about 50,000.

8. A photosensitive mixture as claimed in claim 1, wherein the vinyl acetate content is more than about 5%.

9. A silk-screen stencil or etch resist comprising the photosensitive mixture of claim 8.

* * * * *